(12) United States Patent
Takeda

(10) Patent No.: US 12,354,993 B2
(45) Date of Patent: Jul. 8, 2025

(54) SEMICONDUCTOR DEVICE WITH HAVING A SPRING PORTION

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shun Takeda, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 172 days.

(21) Appl. No.: 17/902,778

(22) Filed: Sep. 2, 2022

(65) Prior Publication Data

US 2023/0299039 A1     Sep. 21, 2023

(30) Foreign Application Priority Data

Mar. 15, 2022   (JP) .................................. 2022-040271

(51) Int. Cl.
  *H01L 23/00*     (2006.01)
(52) U.S. Cl.
  CPC .................................. *H01L 24/72* (2013.01)
(58) Field of Classification Search
  CPC ....................................................... H01L 24/72
  USPC ....................................................... 257/688
  See application file for complete search history.

(56) References Cited

U.S. PATENT DOCUMENTS

| | | | |
|---|---|---|---|
| 6,417,532 B2 * | 7/2002 | Tsunoda | H02M 7/003 257/723 |
| 8,283,763 B2 * | 10/2012 | Oyama | H01L 23/24 257/178 |
| 10,566,316 B2 | 2/2020 | Tanaka et al. | |
| 2002/0064903 A1 * | 5/2002 | Kawata | H01L 23/49575 438/109 |
| 2010/0165582 A1 | 7/2010 | Hornkamp | |
| 2019/0253199 A1 | 8/2019 | Young et al. | |

FOREIGN PATENT DOCUMENTS

| | | |
|---|---|---|
| JP | S63240056 A | 10/1988 |
| JP | H04196580 A | 7/1992 |
| JP | H087956 A | 1/1996 |
| JP | H088374 A | 1/1996 |
| JP | 2000208686 A | 7/2000 |
| JP | 2002359334 A | 12/2002 |

(Continued)

*Primary Examiner* — Ajay Arora
(74) *Attorney, Agent, or Firm* — Kim & Stewart LLP

(57) ABSTRACT

According to one embodiment, a semiconductor device includes a semiconductor circuit having an electrode on a first surface. A case part surrounds the semiconductor circuit. A matching part is provided including a signal terminal on an outside of the matching part and a lead on the inside of the matching part that is electrically connected to the signal terminal. The case part and matching part are configured to engage one another and be attached to one another when pressed together. The lead includes a contact portion that is in contact with the electrode when the matching part is attached to the case part, a first portion connecting between the signal terminal and the contact portion, and a spring portion between the first portion and the contact portion.

21 Claims, 9 Drawing Sheets

(56) References Cited

FOREIGN PATENT DOCUMENTS

| JP | 2003347507 A | | 12/2003 | | |
|----|--------------|---|---------|---|---|
| JP | 2007335719 A | | 12/2007 | | |
| JP | 2012248907 A | | 12/2012 | | |
| JP | 2013140862 A | * | 7/2013 | ............ | H01L 24/73 |
| JP | 2013239512 A | * | 11/2013 | ............ | B23K 3/087 |
| JP | 2014123618 A | | 7/2014 | | |
| JP | 2018107481 A | | 7/2018 | | |
| WO | 2018135465 A1 | | 7/2018 | | |
| WO | 2019157194 A1 | | 8/2019 | | |

* cited by examiner

ATTACH

⇩ ATTACH

↓ ATTACH

SEMICONDUCTOR DEVICE WITH HAVING A SPRING PORTION

CROSS-REFERENCE TO RELATED APPLICATION(S)

This application is based upon and claims the benefit of priority from Japanese Patent Application No. 2022-040271, filed Mar. 15, 2022, the entire contents of which are incorporated herein by reference.

FIELD

Embodiments described herein relate generally to a semiconductor device.

BACKGROUND

A power module is known as a semiconductor device that realizes a high output. A power module can have multiple power semiconductors mounted in one package. A power module may be a 1-in-1, a 2-in-1, a 6-in-1, or the like, in accordance with the number of power semiconductors in the module. Power module can have a signal terminal connected to a semiconductor circuit that is attached to a case in which a semiconductor circuit including a power semiconductor is placed.

DETAILED DESCRIPTION

Figure 1:
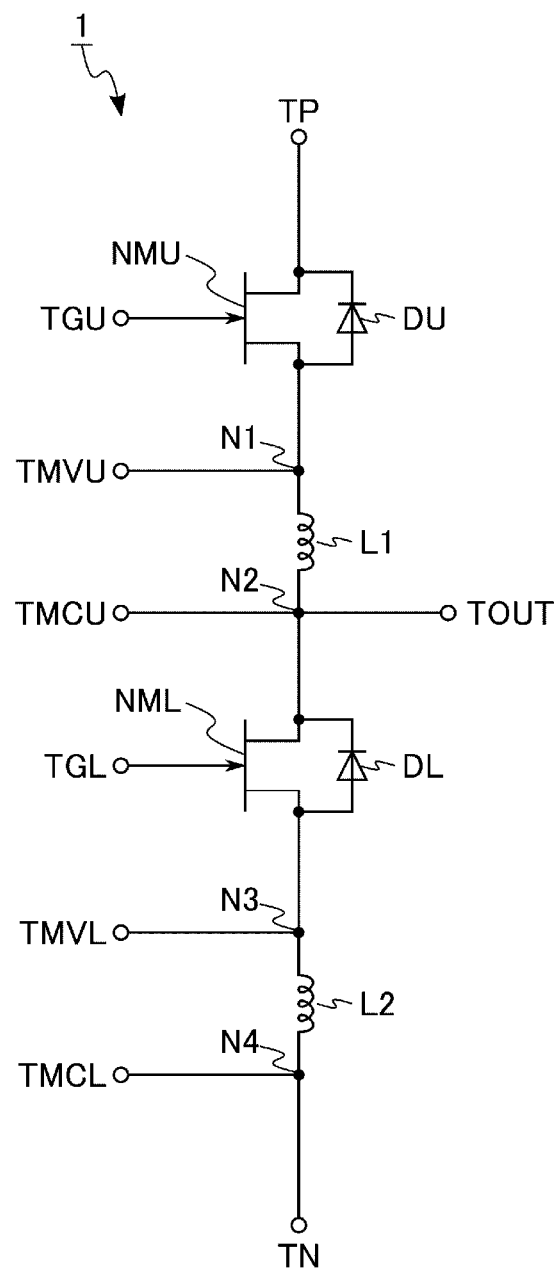
FIG. 1 is a circuit diagram of a semiconductor device according to a first embodiment.

Embodiments provide a facilitation of semiconductor device assembly while reducing inductance of signal terminal wiring.

In general, according to one embodiment, a semiconductor device includes a semiconductor circuit having an electrode on a first surface. A case part surrounds the semiconductor circuit. A matching part is provided including a signal terminal on an outside of the matching part and a lead on the inside of the matching part that is electrically connected to the signal terminal. The case part and matching part are configured to engage one another and be attached to one another when pressed together. The lead includes a contact portion that is in contact with the electrode when the matching part is attached to the case part, a first portion connecting between the signal terminal and the contact portion, and a spring portion between the first portion and the contact portion.

Hereinafter, certain example embodiments will be described with reference to the drawings. Depicted dimensions, dimensional ratios, relative scales, and the like of elements, components, and aspects in the drawings are not necessarily the same as those of an embodiment in actual implementation. The terms or phrases "upper side", "lower side", "left side", and "right side" used in the description of the drawings indicate an upper side, a lower side, a left side, and a right side on the page of the drawing being referred to. In the present specification, identical reference symbols are allotted to components having identical, or substantially so, functions and configurations. In some instances, additional numbers or letters appended to a reference symbol as suffix or the like in order to differentiate between in description elements, components, or aspects sharing the same base reference symbol and that are otherwise similar to each other in points other than those mentioned in relevant context.

1. First Embodiment

A semiconductor device 1 according to a first embodiment is a power module. The semiconductor device 1 can be applied to a railroad car power conversion device, renewable energy generating systems, industrial equipment, or the like. The semiconductor device 1 can have a configuration such that wiring (a lead) having flexibility (springiness) is used for connecting a semiconductor circuit and a signal terminal within a case. In the present example of a first embodiment, the semiconductor device 1 is a 2-in-1 power module.

1-1. Semiconductor Device 1 Circuit Configuration

FIG. 1 is a circuit diagram showing one example of a circuit configuration of the semiconductor device 1 according to the first embodiment. As shown in FIG. 1, the semiconductor device 1 includes terminals TP and TN, a terminal TOUT, terminals TGU and TGL, transistors NMU and NML, inductances L1 and L2, diodes DU and DL, and terminals TMVU, TMVL, TMCU, and TMCL.

The terminals TP and TN are input terminals of the semiconductor device 1. The terminals TP and TN have positive polarity and negative polarity, respectively, in the circuit configuration of the semiconductor device 1. The terminal TP may also be called a "positive terminal". The terminal TN may also be called a "negative terminal".

The terminal TOUT is an output terminal of the semiconductor device 1. The terminal TOUT may also be called an "AC (alternating current) terminal" or "AC terminal".

The terminals TGU and TGL are control terminals of the semiconductor device 1. A control terminal corresponds to a signal terminal used in controlling the driving of an element of a power semiconductor provided in the semiconductor device 1. The terminal TGU may also be called an "upper gate terminal". The terminal TGL may also be called a "lower gate terminal".

Each of the transistors NMU and NML is, for example, an n-type MOS (metal-oxide-semiconductor) transistor. The transistors NMU and NML are connected in series between the terminals TP and TN. The transistor NMU has a drain terminal connected to the terminal TP, a gate terminal connected to the terminal TGU, and a source terminal connected to a node N1. The transistor NML has a drain terminal connected to a node N2, a gate terminal connected to the terminal TGL, and a source terminal connected to a node N3. The transistor NMU may also be called an "upper transistor". The transistor NML may also be called a "lower transistor".

Each of the depicted inductances L1 and L2 is, for example, a parasitic inductance inherent in the circuit configuration of the semiconductor device 1 rather than a discrete inductor element or the like, though for purposes of the description the inductances L1 and L2 (and other parasitic elements) are depicted as discrete elements. The inductance L1 is connected between the transistors NMU and NML. Specifically, a first end of the inductance L1 is connected to the node N1. A second end of the inductance L1 is connected to the node N2. The inductance L2 is connected between the transistor NML and the terminal TN. Specifically, a first end of the inductance L2 is connected to the node N3. A second end of the inductance L2 is connected to a node N4. The node N4 is connected to the terminal TN.

The diode DU is, for example, a parasitic diode of the transistor NMU. The diode DL is, for example, a parasitic diode of the transistor NML. The diode DU is connected in parallel with the transistor NMU, and the diode DL is connected in parallel with the transistor NML, between the terminals TP and TN. Each of the diodes DU and DL functions as a freewheeling diode (FWD).

The terminals TMVU, TMVL, TMCU, and TMCL are monitoring terminals of the semiconductor device 1. A monitoring terminal corresponds to a signal terminal used in monitoring electrical characteristics (for example, voltage or current) of the circuit configuration of the semiconductor device 1.

Each of the terminals TMVU and TMVL is a transistor source potential monitoring terminal. The terminals TMVU and TMVL are connected to the nodes N1 and N3, respectively. That is, the terminal TMVU is used in monitoring a source terminal voltage of the transistor NMU. The terminal TMVL is used in monitoring a source terminal voltage of the transistor NML. The terminal TMU may also be called an "upper source monitoring (sensing) terminal" or the like. The terminal TML may also be called a "lower source monitoring (sensing) terminal" or the like.

The terminals TMCU and TMCL are terminals that monitor current flowing through the semiconductor device 1 and are used in combination with the terminals TMVU and TMVL. The terminals TMCU and TMCL are connected to the nodes N2 and N4, respectively. Current flowing through the transistor NMU may be calculated by detecting the potential difference occurring across the inductance L1 (that is, a difference in potential between the terminals TMVU and TMCU), and calculating backward from the detected potential difference. Current flowing through the transistor NML may be calculated by detecting a potential difference occurring across the inductance L2 (that is, a difference in potential between the terminals TMVL and TMCL), and calculating backward from the detected potential difference.

In the semiconductor device 1, each of the transistors NMU and NML may be an IGBT (insulated-gate bipolar transistor). In practice, multiple transistors NMU may be connected in parallel between the terminal TP and the node N1. Likewise, multiple transistors NML may be connected in parallel between the terminal TN and the node N3. The semiconductor device 1 may include additional signal terminals other than the terminals TGU, TGL, TMVU, TMVL, TMCU, and TMCL. In some examples, one or more of the terminals TMVU, TMVL, TMCU, and TMCL may be omitted from the semiconductor device 1. There may be a multiple of each terminal type in still other examples.

1-2. Semiconductor Device 1 Structure

Figure 2:
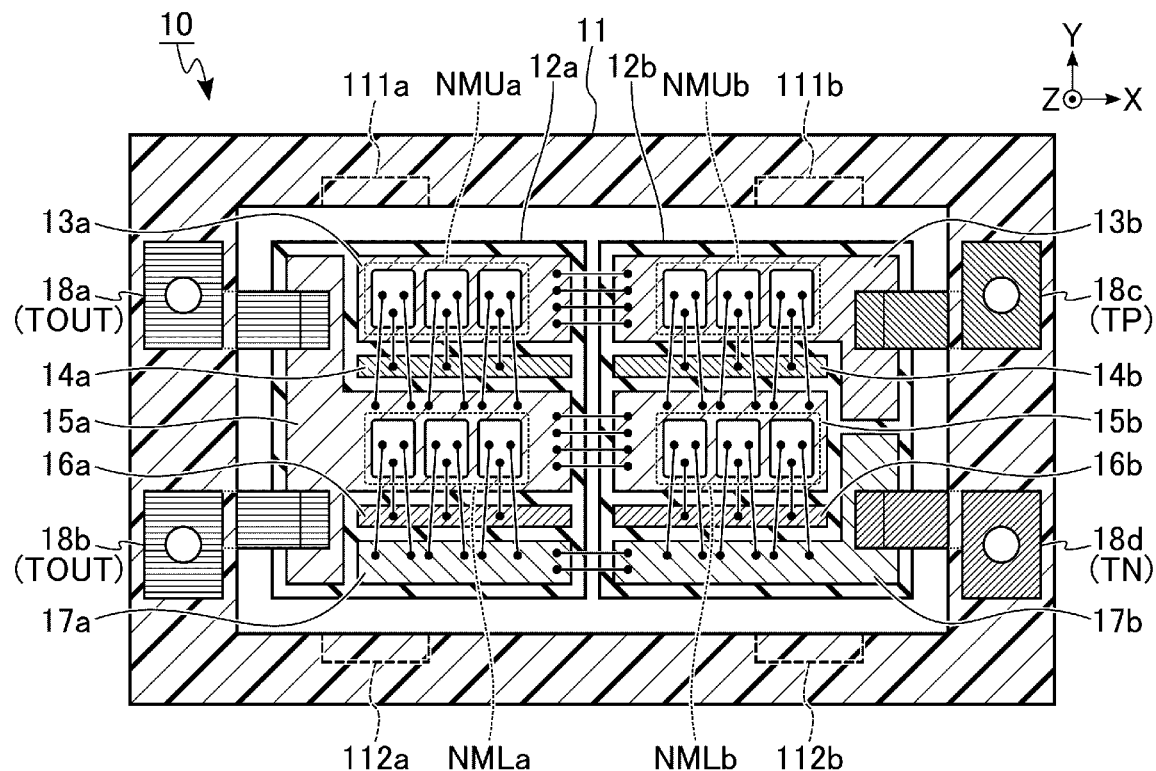
FIG. 2 depicts a planar layout of a case provided in a semiconductor device according to a first embodiment.
Figure 3:
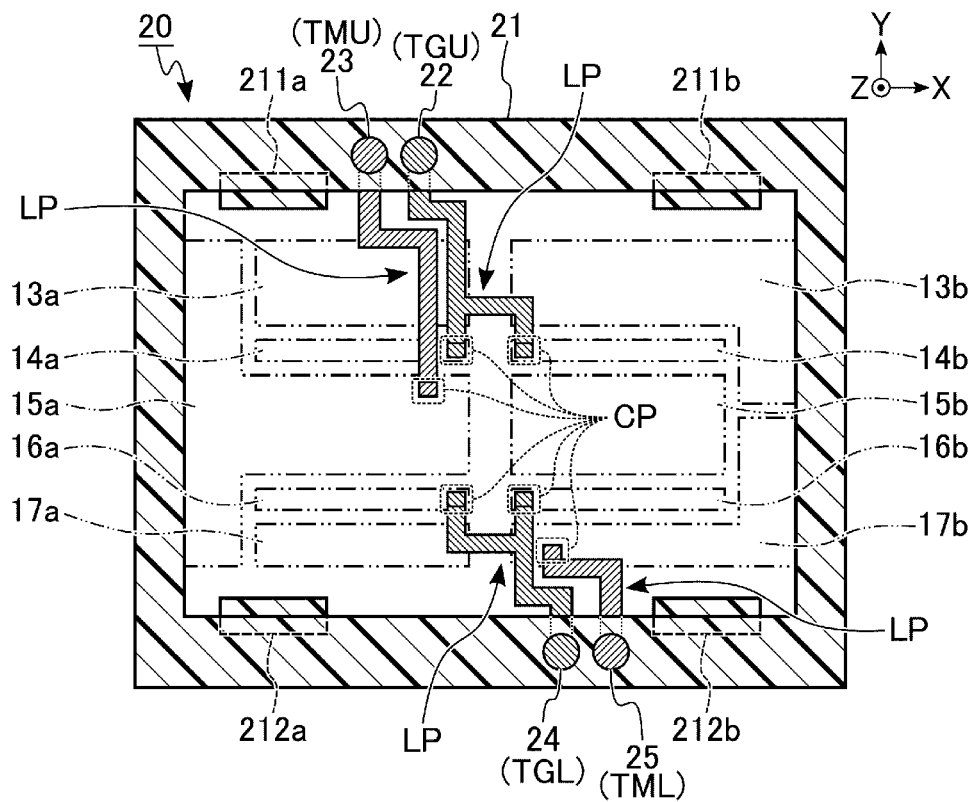
FIG. 3 depicts aspects of a semiconductor device according to the first embodiment.

The semiconductor device 1 is a combination of a case 10 (see, e.g., FIG. 2) and a part 20 (see, e.g., FIG. 3). The case 10 includes a semiconductor circuit such as a power semiconductor device circuit or includes a power semiconductor element or the like. The case 10 may also be referred to as a lower case part 10, a main case part 10, a lower part 10, a lower case 10, a circuit case 10, a circuit case part 10, or the like. The part 20 includes at least one control terminal and wiring (a lead). The part 20 may also be referred to as a matching part 20, a mating part 20, a mated part 20, an upper case part 20, a top part 20, a lead holder part 20, a terminal holder part 20, or the like. In the following description, a signal terminal provided corresponding to the upper transistor (NMU) is called a "terminal TMU", and a signal terminal provided corresponding to the lower transistor (NML) is called a "terminal TML". The description of the structure of the terminal TMU may be applied to the terminals TMVU and TMCU as well. The description of the structure of the terminal TML may be applied to the terminals TMVL and TMCL as well. In the present example, the semiconductor device 1 includes just one set of the terminals TMU and TML.

1-2-1. Case 10 Planar Layout

FIG. 2 is a plan view showing one example of a planar layout of the case 10 provided in the semiconductor device 1 according to the first embodiment. As shown in FIG. 2, the case 10 includes an insulating member 11, insulating substrates 12a and 12b, conductors 13a and 13b, conductors 14a and 14b, conductors 15a and 15b, conductors 16a and 16b, conductors 17a and 17b, and conductors 18a, 18b, 18c, and 18d. Furthermore, the case 10 also includes a base substrate SUB but this is not apparent in FIG. 2 (but see, e.g., FIG. 5).

The base substrate SUB is a supporting body for the semiconductor device 1. The base substrate SUB has a plate form. The base substrate SUB corresponds to a lower portion of a receptacle of the semiconductor device 1. The base substrate SUB has, for example, screw holes in four corners. The base substrate SUB can be fixed to external equipment or the like via the screw holes. The base substrate SUB comprises, for example, copper (Cu) or a ceramic.

The insulating member 11 is provided on the base substrate SUB. The insulating member 11 is an insulating body having a square tube form (an open-ended box form) in this example. The insulating member 11 corresponds to side portions of the receptacle of the semiconductor device 1 and is fixed to the base substrate SUB. The insulating member 11 is, for example, a resin part, such as PPS (polyphenylene sulfide). In the present specification, a plane parallel to a contact face between the base substrate SUB and the insulating member 11 is defined as an XY plane for purposes of description. A longitudinal direction and a lateral direction of the base substrate SUB are defined as an X direction and a Y direction respectively in the XY plane. A Z direction corresponds to a orthogonal direction with respect to the XY plane and may also be referred to as a vertical direction.

The insulating member 11 has receiving portions 111 (111a, 111b) and receiving portions 112 (112a, and 112b).

Each of the receiving portions 111 and 112 is, for example, recessed portion formed in an inner wall of the insulating member 11. Each of the receiving portions 111 and 112 is used in fixing the case 10 and the part 20, and it is sufficient that each of the receiving portions 111 and 112 has a form such that a claw portion provided in the part 20 can latch thereon. The receiving portions 111a and 111b are arranged in the X direction on one side of the inner wall of the insulating member 11. The receiving portions 112a and 112b are arranged in the X direction on another side of the inner wall of the insulating member 11. The receiving portions 111a and 112a are disposed on a left side and oppose each other in the Y direction. The receiving portions 111b and 112b are disposed on a right side and oppose each other in the Y direction.

The insulating substrates 12 (12a and 12b) are insulating substrates that support the circuit configuration of the semiconductor device 1. Each insulating substrate 12 is provided on the base substrate SUB and is surrounded by the insulating member 11 when seen in plan view. That is, the insulating member 11 encloses side portions of the insulating substrate 12. The insulating substrates 12a and 12b are arranged in the X direction, and are disposed one each on the left side and the right side. The insulating substrate 12 comprises, for example, silicon nitride (SiN).

The conductors 13a, 14a, 15a, 16a, and 17a are provided on the insulating substrate 12a. The conductors 13a, 14a, 15a, 16a, and 17a are separated from each other. Also, each of the conductors 13a, 14a, 15a, 16a, and 17a has a portion that extends in the X direction. The portions of the conductors 13a, 14a, 15a, 16a, and 17a that extend in the X direction are arranged in this order along the Y direction. Also, the conductor 15a also has a portion that extends in the Y direction. The portion of the conductor 15a that extends in the Y direction has a portion provided, for example, to the left side of the conductors 13a, 14a, 16a, and 17a.

The conductors 13b, 14b, 15b, 16b, and 17b are provided on the insulating substrate 12b. The conductors 13b, 14b, 15b, 16b, and 17b are separated from each other. Also, each of the conductors 13b, 14b, 15b, 16b, and 17b has a portion that extends in the X direction. The portions of the conductors 13b, 14b, 15b, 16b, and 17b that extend in the X direction are arranged in this order along the Y direction. Also, the conductor 13b has a portion that extends in the Y direction. The portion of the conductor 13b that extends in the Y direction has a portion provided, for example, to the right side of the conductor 14b. The conductor 17b also has a portion that extends in the Y direction. The portion of the conductor 17b that extends in the Y direction has a portion provided, for example, to the right side of the conductor 16b.

Each of the conductors 18a, 18b, 18c, and 18d has a terminal portion and a lead, and is, for example, insert-molded in the insulating member 11. The terminal portion of each of the conductors 18a, 18b, 18c, and 18d has a portion that is exposed when seen from above the insulating member 11. Each of the conductors 18a and 18b corresponds to the terminal TOUT. The conductors 18a and 18b are arranged in the Y direction on the left side of the insulating member 11. The lead of each of the conductors 18a and 18b is connected to the conductor 15a. The conductors 18c and 18d correspond to the terminals TP and TN, respectively. The conductors 18c and 18d are arranged in the Y direction on the right side of the insulating member 11. The lead of the conductor 18c is connected to the conductor 13b. The lead of the conductor 18d is connected to the conductor 17b.

Each of the transistors NMU and NML provided in the semiconductor device 1 is, for example, a vertical transistor. In FIG. 2, each of the transistors NMU and NML is indicated by a quadrilateral region to which no hatching is added. A bottom face (the base substrate SUB side) of the relevant region corresponds to the drain terminal of the transistor. Two dots arranged in the X direction within the relevant region correspond to a source terminal of the transistor. One dot disposed in a lower portion of the relevant region corresponds to the gate terminal of the transistor.

Multiple transistors NMU are arranged in the X direction on the conductor 13a. Hereafter, the transistors NMU on the conductor 13a will be called "transistors NMUa". The drain terminal of each transistor NMUa is connected to the conductor 13a. The gate terminal of each transistor NMUa is connected to the conductor 14a. The source terminal of each transistor NMUa is connected to the conductor 15a.

Multiple transistors NMU are arranged in the X direction on the conductor 13b. Hereafter, the transistors NMU on the conductor 13b will be called "transistors NMUb". The drain terminal of each transistor NMUb is connected to the conductor 13b. The gate terminal of each transistor NMUb is connected to the conductor 14b. The source terminal of each transistor NMUb is connected to the conductor 15b.

Multiple transistors NML are arranged in the X direction on the conductor 15a. Hereafter, the transistors NML on the conductor 15a will be called "transistors NMLa". The drain terminals of the transistors NMLa are connected to the conductor 15a. The gate terminals of the transistors NMLa are connected to the conductor 16a. The source terminals of the transistors NMLa are connected to the conductor 17a.

Multiple transistors NML are arranged in the X direction on the conductor 15b. Hereafter, the transistors NML on the conductor 15b will be called "transistors NMLb". The drain terminals of the transistors NMLb are connected to the conductor 15b. The gate terminals of the transistors NMLb are connected to the conductor 16b. The source terminals of the transistors NMLb are connected to the conductor 17b.

Furthermore, the drains of each of the transistors NMUa and NMUb are electrically connected. The sources of each of the transistors NMUa and NMUb are electrically connected, and the drains of each of the transistors NMLa and NMLb are electrically connected. Likewise, the sources of each of the transistors NMLa and NMLb are electrically connected. Specifically, the pairs of each of the conductors 13a and 13b, the conductors 15a and 15b, and the conductors 17a and 17b are respectively connected by, for example, wire bonding (bonding wires).

The conductors 13a and 13b may be called drain electrodes of the transistors NMUa and NMUb, respectively. The conductors 14a and 14b may be called gate electrodes of the transistors NMUa and NMUb, respectively. The conductors 15a and 15b may be called source electrodes of the transistors NMUa and NMUb, respectively, or drain electrodes of the transistors NMLa and NMLb, respectively. The conductors 16a and 16b may be called gate electrodes of the transistors NMLa and NMLb, respectively. The conductors 17a and 17b may be called source electrodes of the transistors NMLa and NMLb, respectively.

1-2-2. Part 20 Planar Layout

FIG. 3 is a plan view showing one example of a planar layout of the part 20 provided in the semiconductor device 1 according to the first embodiment. Portions of the case 10 disposed coinciding with the part 20 after assembly of the semiconductor device 1 are shown using two-dot chain lines in FIG. 3. As shown in FIG. 3, the part 20 includes, for example, an insulating member 21 and conductors 22, 23, 24, and 25.

The insulating member 21 is, for example, an insulating body having a square tube form. A width in the X direction of the insulating member 21 is, for example, less than a width in the X direction of the insulating member 11 of case 10. A width in the Y direction of the insulating member 21 is, for example, the same as a width in the Y direction of the insulating member 11 of case 10. The insulating member 21 is, for example, a resin part, such as polyphenylene sulfide.

Also, the insulating member 21 has claw portions 211 (211a, 211b) and claw portions 212 (212a, 212b). Each of the claw portions 211 and 212 has a claw form structure for attaching the part 20 to the case 10. Specifically, each of the claw portions 211a, 211b, 212a, and 212b has a portion that protrudes farther to an inner side than the inner wall of the insulating member 11 of the case 10. Further, these portions have a form that is bent to an outer side after extending to the case 10 side in the Z direction. Each of the claw portions 211 and 212 is used in fixing the case 10 and the part 20, and it is sufficient that the claw portions 211 and 212 are of forms that can catch on receiving portions provided in the case 10. The claw portions 211a, 211b, 212a, and 212b are positioned in such a way as to be opposite the corresponding receiving portions 111a, 111b, 112a, and 112b of the case 10.

Each of the conductors 22, 23, 24, and 25 is insert molded in the insulating member 21. The conductors 22, 23, 24, and 25 are separated from each other. The conductors 22, 23, 24, and 25 correspond to the terminals TGU, TMU, TGL, and TML, respectively. That is, the insulating member 21 holds multiple signal terminals. A terminal portion of each of the conductors 22, 23, 24, and 25 corresponds to a portion exposed when seen from above the insulating member 21. Also, each of the conductors 22, 23, 24, and 25 has a lead portion LP and a contact portion CP. Each lead portion LP corresponds to wiring (a lead or a wiring lead) for connecting a corresponding terminal and an electrode (a conductor). Each contact portion CP corresponds to a portion that comes into contact with an electrode (a conductor).

The lead portion LP of the conductor 22 has two branch portions that respectively coincide with the conductors 14a and 14b, and a contact portion CP is provided for each branch portion of the conductor 22. The lead portion LP of the conductor 23 has a portion that coincides with the conductor 15a, and the contact portion CP of the conductor 23 is provided in such a way as to coincide with the portion. The lead portion LP of the conductor 24 has two branch portions that respectively coincide with the conductors 16a and 16b, and a contact portion CP is provided for each branch portion of the conductor 24. The lead portion LP of the conductor 25 has a portion that coincides with the conductor 17a, and the contact portion CP of the conductor 25 is provided in such a way as to coincide with the portion. The terminal portion and the lead portion LP of a signal terminal may be formed as integrated portions, or may be formed from divided (separate) portions. It is sufficient that a conductor corresponding to a signal terminal has a terminal portion and a lead portion LP that are electrically connected in some manner.

1-2-3. Semiconductor Device 1 Planar Layout

Figure 4:
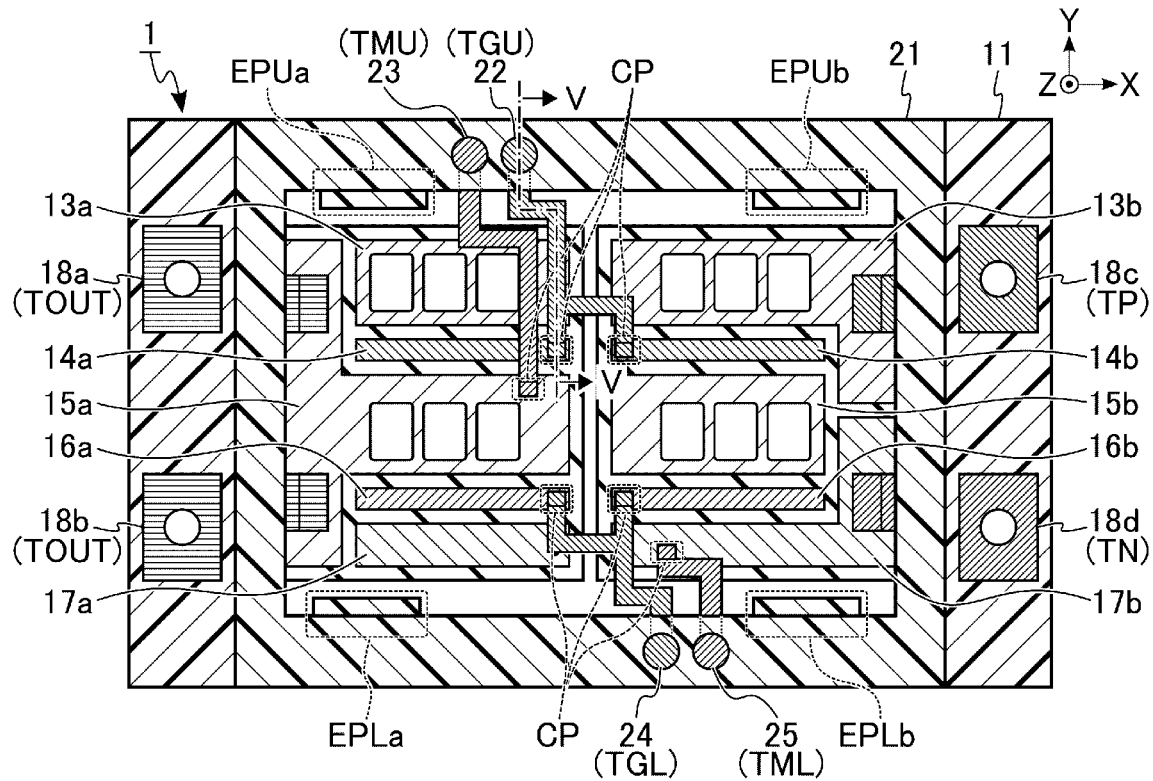
FIG. 4 is a plan view of a semiconductor device according to the first embodiment.

FIG. 4 is a plan view showing one example of a planar layout of the semiconductor device 1 according to the first embodiment. FIG. 4 corresponds to a planar layout after the part 20 is attached to the case 10; however, for depictional clarity, various wiring such as wire bondings in the case 10 are omitted from the drawing. As shown in FIG. 4, the semiconductor device 1 includes, for example, engaged portions EPUa, EPUb, EPLa, and EPLb.

A receiving portion of the case 10 and a claw portion of the part 20 are engaged in each of the engaged portions EPUa, EPUb, EPLa, and EPLb. Specifically, the receiving portion 111a and the claw portion 211a are engaged in the engaged portion EPUa. The receiving portion 111b and the claw portion 211b are engaged in the engaged portion EPUb. The receiving portion 112a and the claw portion 212a are engaged in the engaged portion EPLa. The receiving portion 112b and the claw portion 212b are engaged in the engaged portion EPLb. Because of this, the part 20 can be said to be attached to the case 10, or the part 20 can be said to be fixed to the case 10.

When the part 20 is attached to the case 10, the two contact portions CP of the conductor 22 (the terminal TGU) are pressed against the conductors 14a and 14b, respectively. In the same way, the contact portion CP of the conductor 23 (the terminal TMU) is pressed against the conductor 15a. In the same way, the two contact portions CP of the conductor 24 (the terminal TGL) are pressed against the conductors 16a and 16b, respectively. In the same way, the contact portion CP of the conductor 25 (the terminal TML) is pressed against the conductor 17b. Further, in order to provide a pressure (or force) (hereafter called "pressure contact force") to press the contact portion CP and a conductor together, the semiconductor device 1 utilizes wiring having elasticity (springiness).

Although not specifically depicted in FIG. 4, a cover or lid may be provided on the part 20. The cover is, for example, fixed to the part 20, and seals a space in which the circuit of the semiconductor device 1 is provided. The cover can be an insulating body formed of polyphenylene sulfide or the like.

1-2-4. Semiconductor Device 1 Side View

Figure 5:
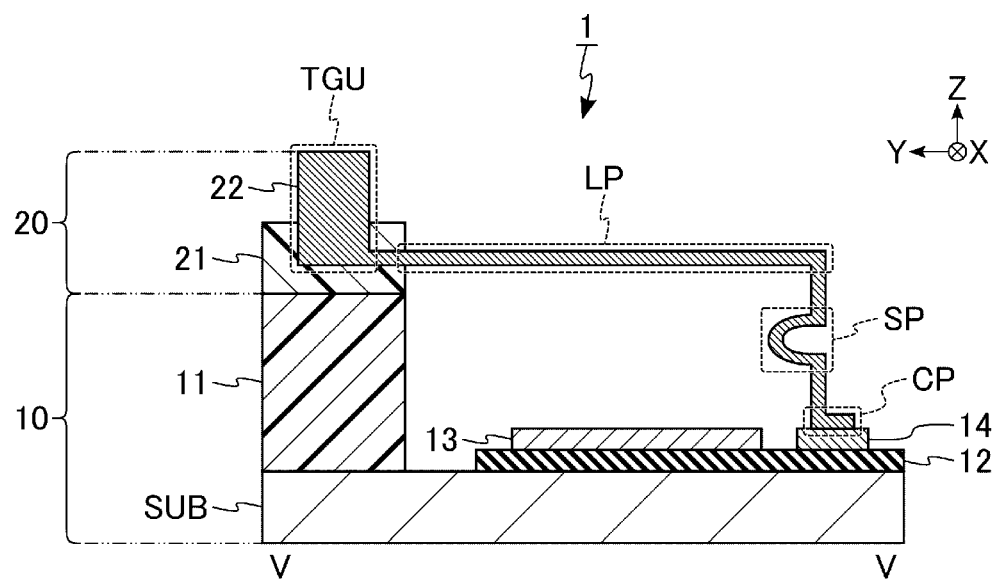
FIG. 5 is a cross-sectional view taken along a V-V line of FIG. 4.
Figure 6:
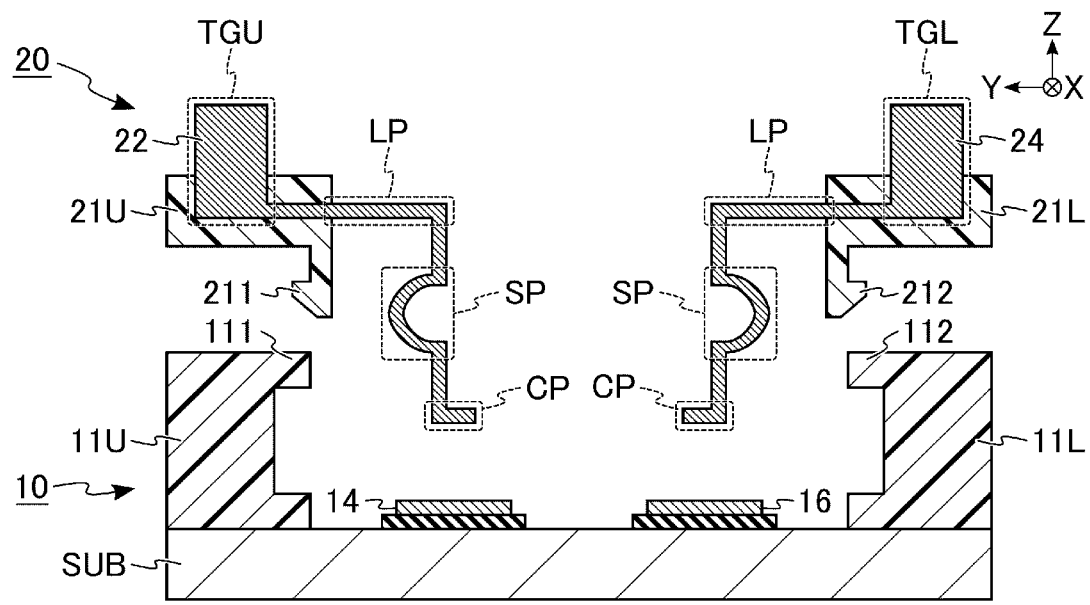
FIG. 6 shows structures before and after assembly of a semiconductor device according to a first embodiment.
Figure 6:
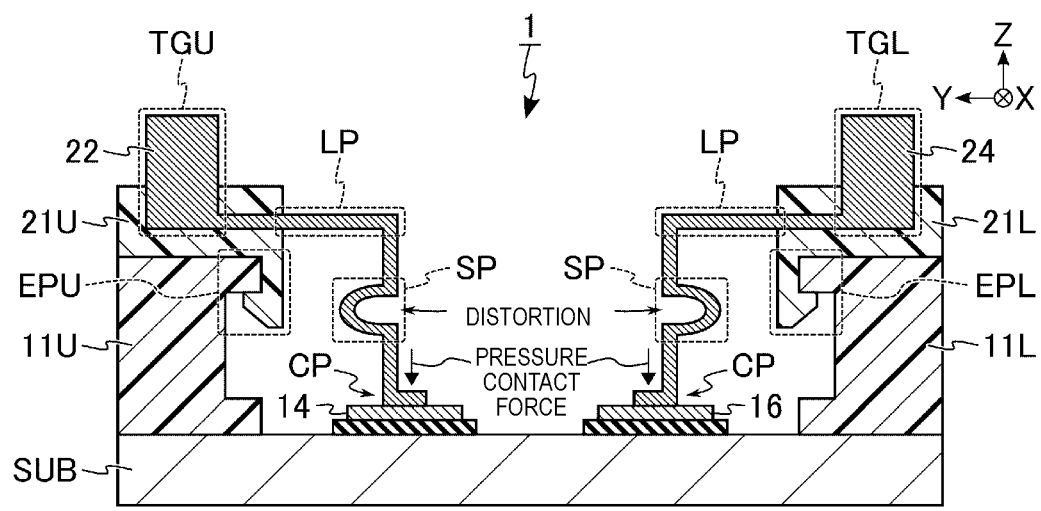

FIG. 5 shows one example of a cross-sectional structure of the semiconductor device 1 according to the first embodiment. FIG. 6 corresponding in position to a V-V line of FIG. 4. FIG. 5 shows a region corresponding to the conductor 22 (the terminal TGU) extracted as one example of a structure of a signal terminal of the first embodiment. As shown in FIG. 5, the part 20 has been mounted on the case 10. Each of the insulating member 11 and the insulating substrate 12 is provided on the base substrate SUB. Each of the conductors 13 and 14 is provided on the insulating substrate 12. A height of the insulating member 11 is greater than a total height of the insulating substrate 12 and the conductor 13. The insulating member 21 of the part 20 is provided on the insulating member 11 of the case 10.

The conductor 22 has the terminal portion (the terminal TGU), the lead portion LP, the contact portion CP, and a spring portion SP. The terminal TGU, the lead portion LP, the spring portion SP, and the contact portion CP are provided continuously in this order along the length of the conductor 22. As it is sufficient that the terminal TGU and the lead portion LP are electrically connected, the terminal TGU and the lead portion LP may be formed separately in other examples. A portion wherein the lead portion LP, the spring portion SP, and the contact portion CP are provided continuously in the conductor 22 may be called "signal terminal wiring (leads)". The lead portion LP may be called a "wiring bridge portion".

The terminal TGU and the lead portion LP each have a portion that is insert molded in the insulating member 21.

The terminal TGU has a portion that extends in the Z direction and, for example, protrudes upward from the insulating member 21. The lead portion LP has a plate-form portion that extends in the Y direction. The contact portion CP is provided in a plate form such that face-to-face contact can be made with the conductor 14. The contact portion CP has a portion that coincides with an end portion of the lead portion LP in the Z direction. The end portion of the lead portion LP and the contact portion CP are connected via a plate-form portion that extends in the Z direction.

The spring portion SP is provided between the end portion of the lead portion LP and the contact portion CP. The spring portion SP may also be called a bent portion or a flex portion. In the spring portion SP, the conductor 22 is bent in such a way as to protrude in a direction parallel to the XY plane. Specifically, the conductor 22 in the spring portion SP has a form that is bent along a circumference of a semi-ellipsoid, for example. The spring portion SP has elasticity (springiness). In the semiconductor device 1, the contact portion CP is pressed against the conductor 14 by force (spring force) generated by the elasticity of the spring portion SP.

In the above description, the conductor 22 (the terminal TGU) is described as one example of a signal terminal structure. The other signal terminals also have the same structure as the terminal TGU. The lead portion LP is preferably configured in such a way that distortion when the part 20 is attached to the case 10 can be restricted other than that of the spring portion SP. In some examples, the lead portion LP may have a portion that is distorted (bent) in the Z direction. The form of the spring portion SP not being limited to a bent plate form, it is sufficient that the spring portion SP has springiness or the like sufficient to provide a pressure contact force.

1-3. Semiconductor Device 1 Side Views Before and After Assembly

FIG. 6 shows cross-sectional structures before and after assembly of the semiconductor device 1 according to the first embodiment. The top portion of FIG. 6 shows a structure before assembly, and the bottom portion of FIG. 6 shows a structure after assembly of the semiconductor device 1. FIG. 6 show a structure of the semiconductor device 1 schematically in order to represent an aspect wherein a receiving portion of the case 10 and a claw portion of the part 20 are engaged, and also an aspect shown in FIG. 3 wherein the terminals TGU and TGL disposed on the upper side and the lower side, respectively, of the part 20 are connected to electrodes.

Hereafter, a portion of the insulating member 11 on the upper side of the case 10 shown in FIG. 2 will be called an "insulating member 11U", and a portion on the lower side of the case 10 shown in FIG. 2 will be called an "insulating member 11L". In the same way, a portion of the insulating member 21 of the part 20 disposed on the upper side of the part 20 shown in FIG. 3 will be called an "insulating member 21U", and a portion disposed on the lower side of the part 20 shown in FIG. 3 will be called an "insulating member 21L".

As shown in FIG. 6 (upper portion), the receiving portion 111 provided in the insulating member 11U and the claw portion 211 provided in the insulating member 21U are disposed opposing each other in the Z direction. The receiving portion 112 provided in the insulating member 11L and the claw portion 212 provided in the insulating member 21L are disposed opposing each other in the Z direction. The conductor 22 (the terminal TGU) is insert molded in the insulating member 21U. The spring portion SP of this conductor 22 is depicted in a state wherein no weight (force) is being applied. In the same way, the spring portion SP of the conductor 24 (the terminal TGL), insert molded in the insulating member 21L, is depicted in a state wherein no weight (force) is being applied. The part 20 is attached to the case 10 when pressed together towards the base substrate SUB side.

Upon the part 20 being attached to the case 10, the receiving portion 111 and the claw portion 211 engage, whereby the engaged portion EPU is formed, as shown in FIG. 6 (lower portion). In the same way, the receiving portion 112 and the claw portion 212 engage, whereby the engaged portion EPL is formed. Because of this, the part 20 is fixed to the case 10. Also, when the contact portion CP of the conductor 22 comes into contact with the conductor 14 in the process of the part 20 being attached to the case 10, the spring portion SP of the conductor 22 is distorted due to pressure in the Z direction being applied via the lead portion LP of the conductor 22. Furthermore, upon the part 20 being attached to the case 10, a pressure contact force is generated by the elasticity of the spring portion SP and applied to the contact portion CP. In other words, the contact portion CP of the conductor 22 is now being pressed onto the conductor 14 (electrode). As a result of this, a bottom face of the contact portion CP of the conductor 22 presses against a top face of the conductor 14, thereby being electrically connected to the conductor 14. In the same way, a bottom face of the contact portion CP of the conductor 24 presses against a top face of the conductor 16, thereby being electrically connected to the conductor 16.

1-4. Advantages of First Embodiment

Wire bonding, ultrasonic bonding, solder bonding, and the like, are known methods of connecting a signal terminal and a gate terminal provided in a semiconductor circuit. However, when wire bonding is used, gate wiring increases in length, and there is concern that wiring inductance will increase. Also, the regions provided to permit the wire bonding may become dead (unused) space after fabrication. Ultrasonic bonding is such that when a ceramic substrate is used as a base substrate, there is concern that the ceramic substrate will crack. Also, ultrasonic bonding generally cannot be employed when a resin substrate is used as a base substrate. With solder bonding, there is concern that a case material or the like cannot withstand a usual reflow temperature in associated manufacturing processes.

Therefore, the semiconductor device 1 according to the first embodiment includes a part 20 in which a signal terminal (or a plurality of signal terminals) is insert molded. Further, the semiconductor device 1 is such that upon the part 20 being fitted into the case 10, wiring (a lead) of the signal terminal is pressed against an internal circuit by pressure contact force of the spring portion SP, thereby being sufficiently and stably electrically connected to the internal circuit. That is, additional processes such as wire bonding, ultrasonic bonding, or solder bonding for connecting a signal terminal and an internal circuit are unneeded in the manufacturing process of the semiconductor device 1, and overall number of processes needed for assembling the case 10 and the part 20 may be reduced.

Because of this, the semiconductor device 1 is such that a difficulty of assembly is reduced, and a manufacturing cost may be lowered. Also, the semiconductor device 1 is such that there is no need to leave additional space for wire bonding processes or the like for connecting a signal terminal and an internal circuit, thus signal terminal wiring may be designed to be more compact. Because the signal terminal wiring may be more compact, parasitic inductance or the like may be reduced in design. Consequently, the semiconductor device 1 according to the first embodiment is such that an area available for main or other wiring is enlarged owing to signal terminal wiring being compact, and assembly of the semiconductor device 1 can be facilitated while reducing signal terminal and other wiring inductance and wiring resistance.

The semiconductor device 1 is such that pressure bonding is utilized between a signal terminal and an internal circuit, because of which fixing may be carried out substantially stress-free with respect to the base substrate SUB and the like. As a result of this, the semiconductor device 1 is such that reliability of a connection of a signal terminal and an internal circuit can be increased.

A power module can be such that an external terminal type, number, and position is defined by a standard. This means that when a fixed, independent standard is to be meet versatility with respect to signal terminal design can be lost. However, the semiconductor device 1 according to the first embodiment is such that a signal terminal and an electrode are electrically connected using a simple wiring structure, as such many internal designs and variations can be possible that still ultimately accord with the standard to be met. Consequently, the semiconductor device 1 according to the first embodiment is such that a design costs and the like of a system in which a power module is used can be minimized.

1-5. First Embodiment Modification

Wiring thicknesses of signal terminals as described in the first embodiment need not be necessarily uniform.

Figure 7:
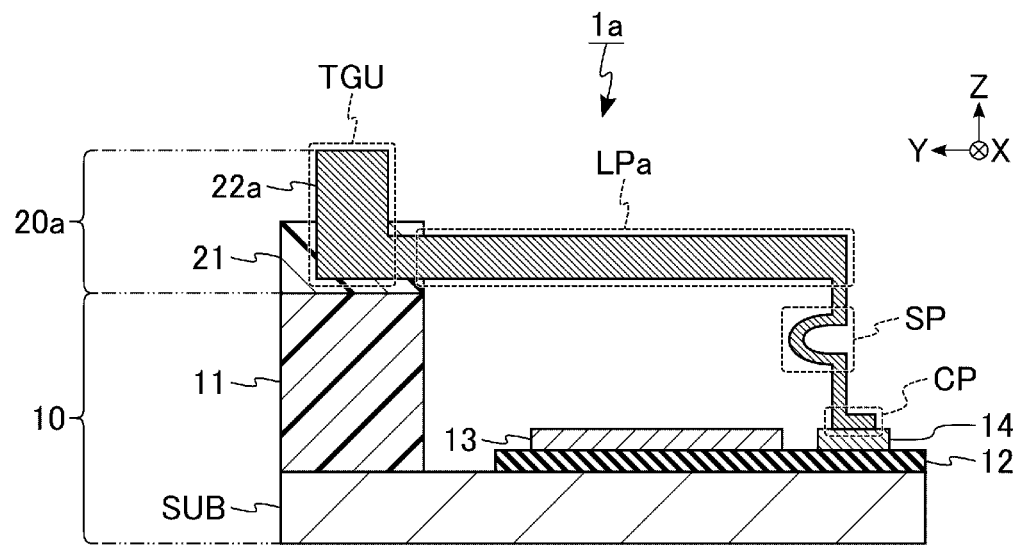
FIG. 7 is a cross-sectional view of a semiconductor device according to a modification of the first embodiment.

FIG. 7 is side view showing one example of a cross-sectional structure of a semiconductor device 1a according to a modification of the first embodiment. As shown in FIG. 7, the semiconductor device 1a includes the case 10 and a part 20a. The part 20a has a structure wherein the conductor 22 (the terminal TGU) in the part 20 of the first embodiment is replaced by a conductor 22a.

The conductor 22a has a terminal portion (the terminal TGU), a lead portion LPa, the contact portion CP, and the spring portion SP. The conductor 22a in the lead portion LPa is thicker than other wiring portions (for example, the spring portion SP and the contact portion CP). In other words, the thickness of the conductor 22a (the signal terminal wiring) is such that the lead portion LPa is thicker than the spring portion SP. Because of this, the lead portion LPa has higher rigidity than the lead portion LP of the first embodiment. As structures of signal terminals other than the terminal TGU in the modification of the first embodiment are similar to that of the conductor 22a, additional description will be omitted. The rest of the configurations of the semiconductor device 1a according to the modification of the first embodiment can be the same as in the first embodiment.

Distortion of the lead portion LP may affect the contact between the contact portion CP and the electrode. That is, distortion of a lead portion LP may be a cause of variation in a contact state of the contact portion CP. In view of this, the semiconductor device 1a according to the modification of the first embodiment is such that distortion of the lead portion LP when the part 20a is attached to the case 10 can be restricted further than in the first embodiment. Consequently, the semiconductor device 1a is such that variation in characteristics of the power module resulting from the contact state of the contact portion CP can be further restricted.

Second Embodiment

A semiconductor device 1b according to a second embodiment has a configuration wherein the spring portion SP has a structure differing from that of the semiconductor device 1 according to the first embodiment. Hereafter, points in the second embodiment that differ from the first embodiment will be primarily described.

2-1. Semiconductor Device 1b Cross-Sectional Structure

Figure 8:
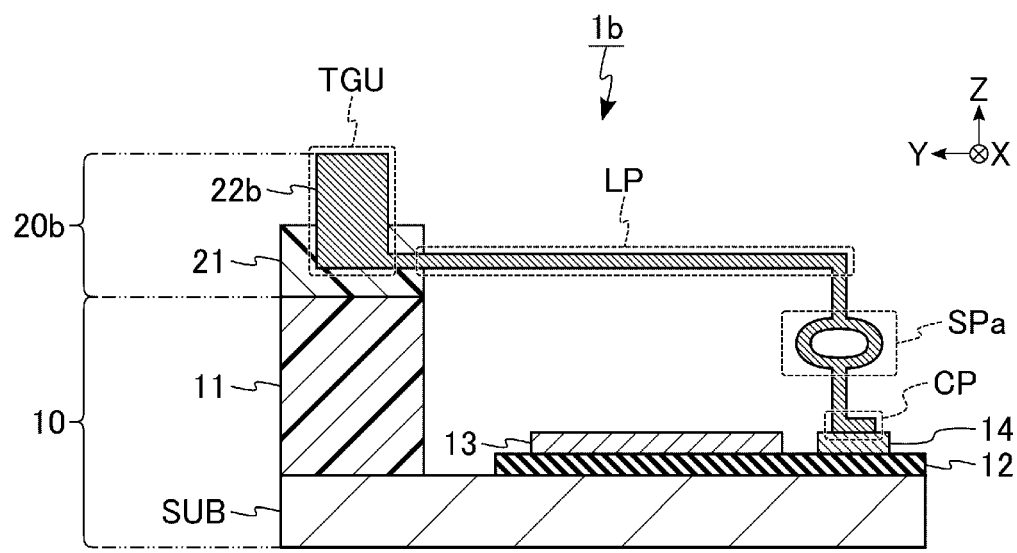
FIG. 8 is a cross-sectional view of a semiconductor device according to a second embodiment.

FIG. 8 is a side view showing one example of a cross-sectional structure of the semiconductor device 1b according to the second embodiment. As shown in FIG. 8, the semiconductor device 1b includes the case 10 and a part 20b. The part 20b has a configuration wherein the conductor 22 (the terminal TGU) in the part 20 of the first embodiment is replaced by a conductor 22b.

The conductor 22b has the terminal portion (the terminal TGU), the lead portion LP, the contact portion CP, and a spring portion SPa. The spring portion SPa is provided between an end portion of the lead portion LP and the contact portion CP. The conductor 22b has a loop form in the spring portion SPa. The spring portion SPa has elasticity (springiness). In the semiconductor device 1b, the contact portion CP is pressed against the conductor 14 by pressure generated by the elasticity of the spring portion SPa. As structures of signal terminals other than the terminal TGU in the second embodiment are similar to that of the conductor 22b, additional description will be omitted. The rest of the configurations of the semiconductor device 1b according to the second embodiment can be the same as in the first embodiment.

2-2. Semiconductor Device 1b Side Views Before and After Assembly

Figure 9:
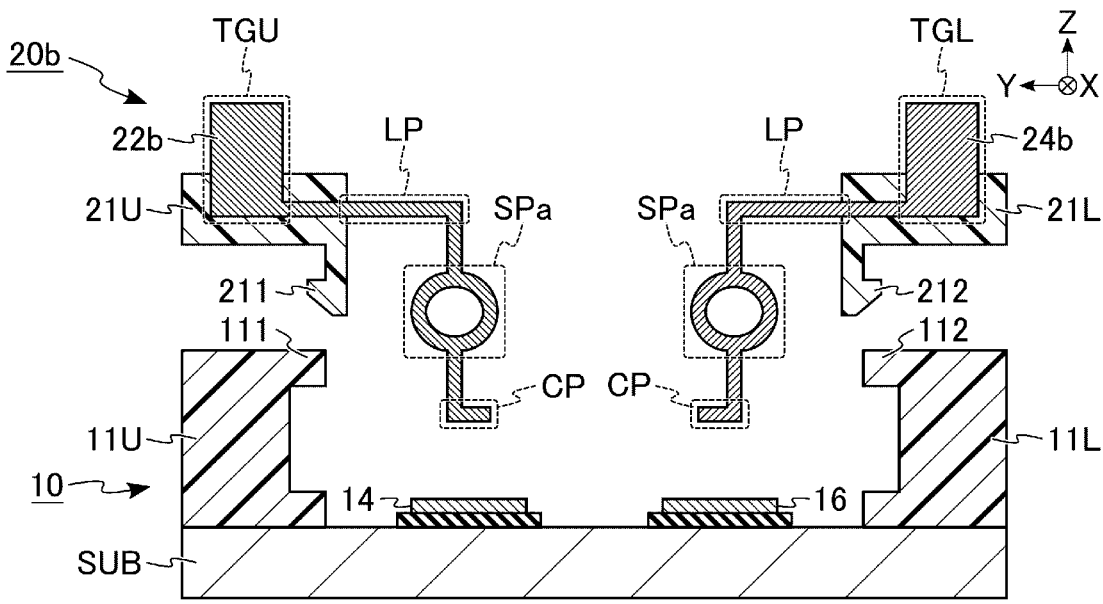
FIG. 9 shows structures before and after assembly of a semiconductor device according to a second embodiment.
Figure 9:
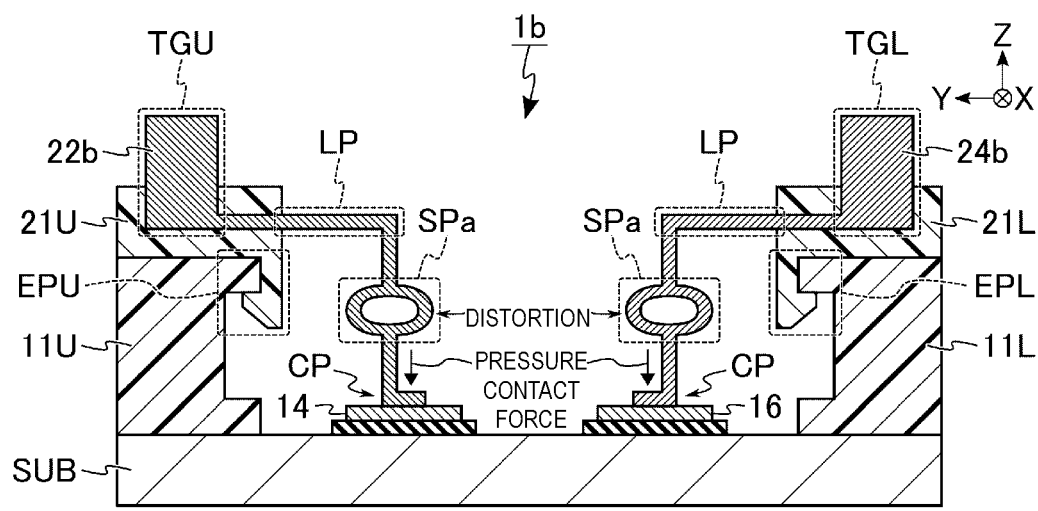

FIG. 9 show cross-sectional structures before and after assembly of the semiconductor device 1b according to the second embodiment. Also, FIG. 9 shows a structure of the semiconductor device 1b schematically in order to represent an aspect wherein a receiving portion of the case 10 and a claw portion of the part 20b are engaged, and an aspect wherein the terminals TGU and TGL of the part 20b are connected to electrodes.

As shown in FIG. 9 (upper portion), the spring portion SPa of the conductor 22b is depicted in a state wherein no weight (force) is being applied. In the same way, the spring portion SPa of a conductor 24b is depicted in a state wherein no weight (force) is being applied.

Upon the part 20b being attached to the case 10, the engaged portions EPU and EPL are formed, whereby the part 20b is fixed to the case 10, as shown in FIG. 9 (bottom portion). Upon the contact portion CP of the conductor 22b coming into contact with the conductor 14, the spring portion SPa of the conductor 22b is distorted due to pressure in the Z direction being applied by the lead portion LP of the conductor 22b. Furthermore, upon the part 20b being attached to the case 10, pressure contact force generated by the elasticity of the spring portion SPa of the conductor 22b is applied to the contact portion CP of the conductor 22b. As a result of this, the bottom face of the contact portion CP of the conductor 22b is pressed approximately evenly against the top face of the conductor 14, thereby being electrically connected to the conductor 14. In the same way, the bottom face of the contact portion CP of the conductor 24 is pressed approximately evenly against the top face of the conductor 16, thereby being electrically connected to the conductor 16.

2-3. Advantages of Second Embodiment

The semiconductor device 1b according to the second embodiment is such that the spring portion SPa provided in a signal terminal lead has a loop form. Because of this, pressure applied to the contact portion CP when the case 10 and the part 20b are assembled may be more even than in the first embodiment owing to the loop form. Consequently, the semiconductor device 1b has same advantages as in the first, but variation in characteristics of the power module resulting from the contact state of the contact portion CP can be additionally restricted.

Third Embodiment

A semiconductor device 1c according to a third embodiment includes a part 20c which also functions as a cover of the case 10.

3-1. Part 20c Planar Layout

Figure 10:
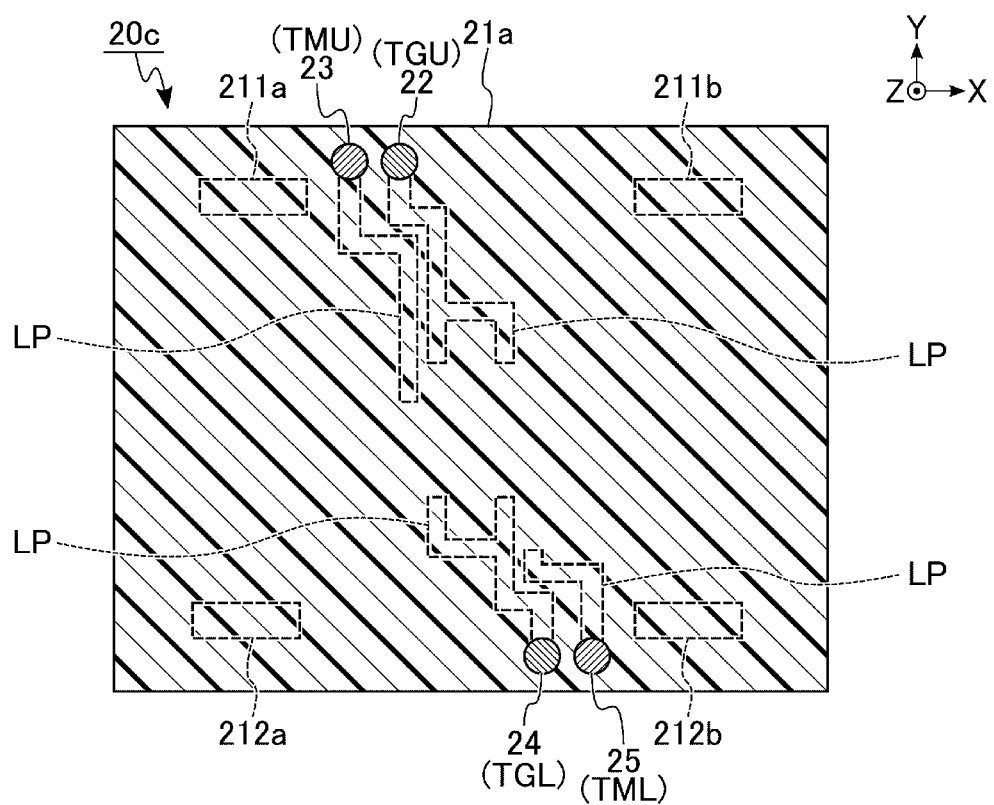
FIG. 10 is a plan view of a part of a semiconductor device according to a third embodiment.

FIG. 10 is a plan view showing one example of a planar layout of the part 20c provided in the semiconductor device 1c according to the third embodiment. Portions provided in an interior or on a bottom portion of the part 20c are indicated by broken lines in FIG. 10. As shown in FIG. 10, the part 20c includes an insulating member 21a and the conductors 22, 23, 24, and 25.

The insulating member 21a is, for example, a plate-form insulating body. In the same way as the insulating member 21, the insulating member 21a has the claw portions 211a, 211b, 212a, and 212b. Each of the claw portions 211a, 211b, 212a, and 212b of the insulating member 21a is used in fixing the case 10 and the part 20c, and is provided in a form that can catch on a receiving portion provided in the case 10. Further, the claw portions 211a, 211b, 212a, and 212b of the part 20c are provided to oppose the receiving portions 111a, 111b, 112a, and 112b of the case 10.

A terminal portion of each of the conductors 22, 23, 24, and 25 of the part 20c corresponds to a portion exposed when seen from above the insulating member 21a. Each of the conductors 22, 23, 24, and 25 of the part 20c is insert molded in the insulating member 21a. The lead portion LP of each of the conductors 22, 23, 24, and 25 of the part 20c is provided in, for example, a center of the insulating member 21a. The rest of the configurations of the semiconductor device 1c according to the third embodiment are the same as in the first embodiment.

3-2. Semiconductor Device 1c Side Views Before and After Assembly

Figure 11:
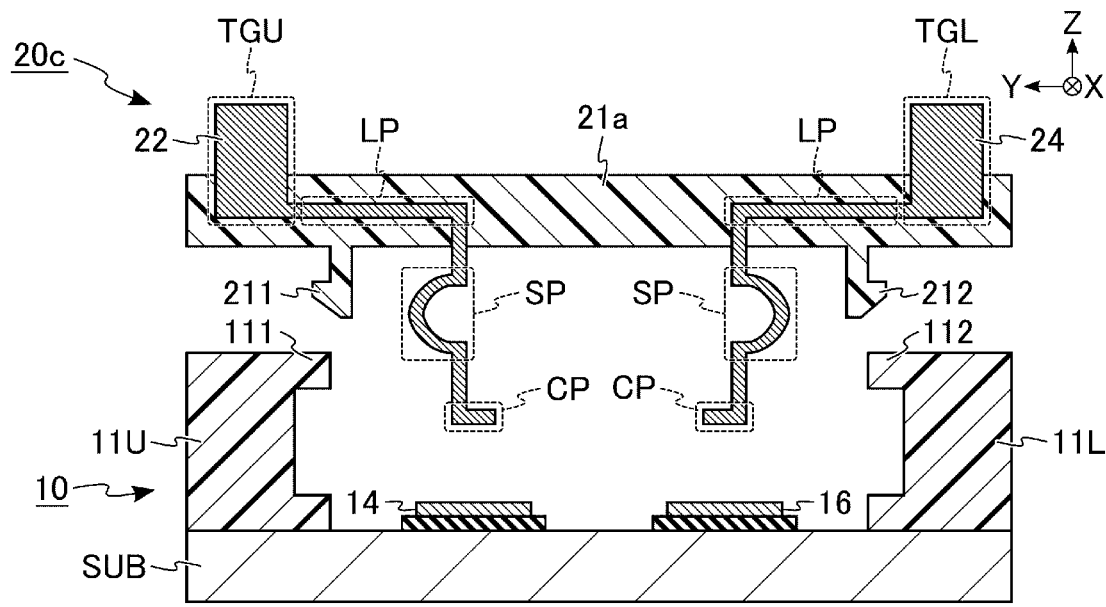
FIG. 11 shows structures before and after assembly of a semiconductor device according to a third embodiment.
Figure 11:
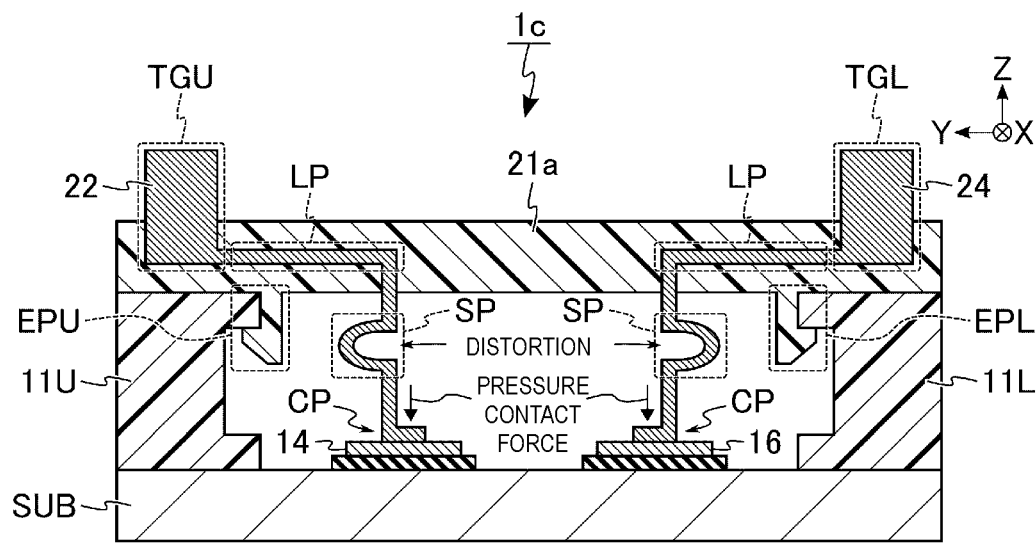

FIG. 11 shows cross-sectional structures before and after assembly of the semiconductor device 1c according to the third embodiment. FIG. 11 shows a structure of the semiconductor device 1c schematically in order to represent an aspect wherein a receiving portion of the case 10 and a claw portion of the part 20c are engaged, and an aspect wherein the terminals TGU and TGL of the part 20c are connected to electrodes.

As shown in FIG. 11 (upper portion), the spring portion SP of the conductor 22 (the terminal TGU) is depicted in a state wherein no weight (force) is being applied. In the same way, the spring portion SP of the conductor 24 (the terminal TGL) is depicted in a state wherein no weight (force) is being applied.

Upon the part 20c being attached to the case 10, the engaged portions EPU and EPL are formed, whereby the part 20c is fixed to the case 10, as shown in FIG. 11 (bottom portion). Also, upon the part 20c being attached to the case 10, pressure contact force generated by the elasticity of the spring portion SP of the conductor 22 is applied to the contact portion CP of the conductor 22. As a result of this, the bottom face of the contact portion CP of the conductor 22 is pressed against the top face of the conductor 14, thereby being electrically connected to the conductor 14. In the same way, the bottom face of the contact portion CP of the conductor 24 is pressed against the top face of the conductor 16, thereby being electrically connected to the conductor 16.

3-3. Advantages of Third Embodiment

The semiconductor device 1c according to the third embodiment is such that the insulating member 21a holding signal terminals has a configuration that is integrated with a cover of the case 10. When the case 10 and the part 20c are assembled, a semiconductor circuit is disposed in the space enclosed by the case 10 and the insulating member 21a. That is, the insulating member 21a is also used as a cover of the semiconductor device 1c. As a result of this, the semiconductor device 1c according to the third embodiment is such that the total number of separate parts is reduced, and the number of assembly man hours can be reduced. Consequently, the same advantages as in the first embodiment can be obtained, but a power module manufacturing cost can be further reduced.

3-4. Third Embodiment Modification

In the semiconductor device 1c according to the third embodiment, a receiving portion of the case 10 may be replaced by a claw portion, and a claw portion of the part 20c replaced by a receiving portion. That is, a claw portion that fixes the part 20c may be formed on the case 10 side rather than vice versa.

Figure 12:
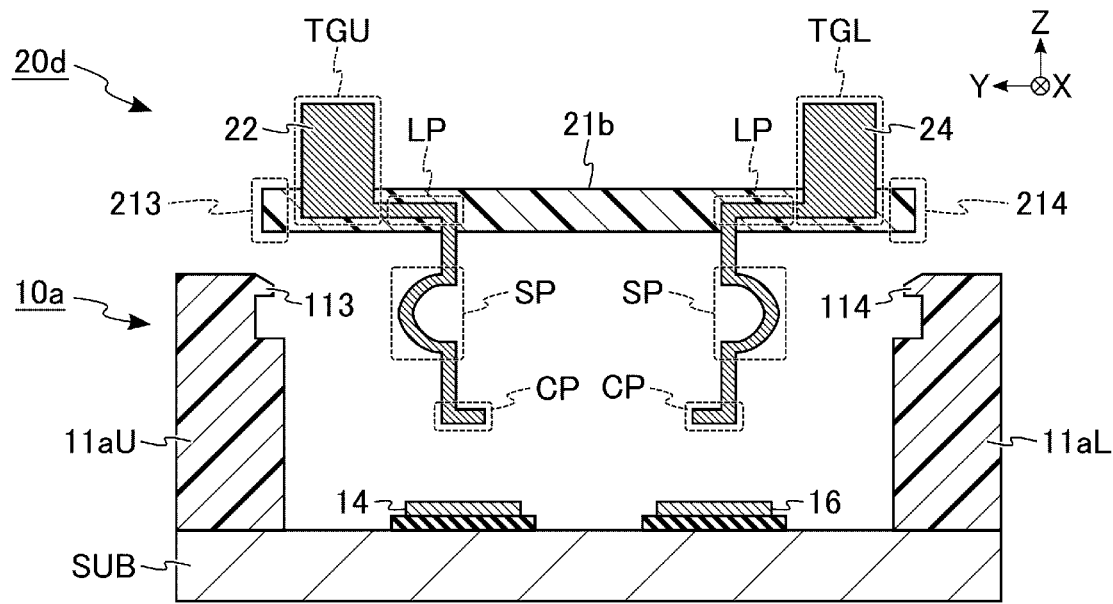
FIG. 12 shows structures before and after assembly of a semiconductor device according to a modification of the third embodiment.
Figure 12:
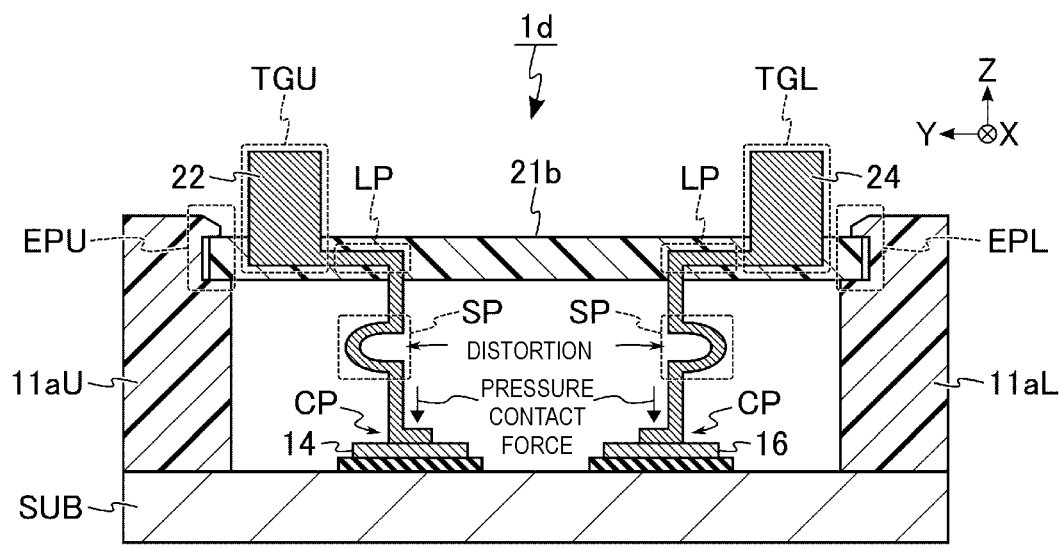

FIG. 12 shows cross-sectional structures before and after assembly of a semiconductor device 1d according to a modification of the third embodiment. Also, FIG. 12 shows a structure of the semiconductor device 1d schematically in order to represent an aspect wherein a claw portion of a case 10a and a receiving portion of a part 20d are engaged, and an aspect wherein the terminals TGU and TGL of the part 20d are connected to electrodes.

As shown in FIG. 12, the case 10a has a configuration wherein the insulating members 11U and 11L are replaced by insulating members 11aU and 11aL in the case 10 of the first embodiment. The insulating members 11aU and 11aL have claw portions 113 and 114, respectively. The part 20d has a configuration wherein the insulating member 21a is replaced by an insulating member 21b in the part 20c of the third embodiment. The insulating member 21b has a receiving portion 213 corresponding to a claw portion 113, and a receiving portion 214 corresponding to a claw portion 114.

As shown in FIG. 12 (upper portion), the claw portion 113 provided in the insulating member 11aU and the receiving portion 213 provided in the insulating member 21b are disposed opposing in the Z direction. The claw portion 114 provided in the insulating member 11aL and the receiving portion 214 provided in the insulating member 21b are disposed opposing in the Z direction. The part 20d is attached to the case 10a when pressed to the base substrate SUB side.

Upon the part 20d being attached to the case 10a, the engaged portions EPU and EPL are formed, in substantially the same way as in the first embodiment, whereby the part 20d is fixed to the case 10a, as shown in FIG. 12 (bottom portion). Also, by the part 20d being attached to the case 10a, the bottom face of the contact portion CP of the conductor 22 is pressed against the top face of the conductor 14, thereby being electrically connected to the conductor 14. In the same way, the bottom face of the contact portion CP of the conductor 24 is pressed against the top face of the conductor 16, thereby being electrically connected to the conductor 16.

The semiconductor device 1d according to this modification of the third embodiment is such that the same advantages as in the third embodiment can be obtained.

4. Other

In each embodiment, a description is given with a case wherein the semiconductor device 1 is a 2-in-1 power module as an example, but the disclosure is not limited to this. The configuration of each embodiment may also be applied to another power module type, such as a 1-in-1 or a 6-in-1. In each embodiment, a description is given with a case wherein signal terminal wiring is insert molded in the insulating member 21 (or the like), but this is not limiting. Signal terminal wiring may also be "outsert" molded in the insulating member 21. That is, wiring portions may run along a surface of the insulating member 21 (or the like) rather than within the insulating member 21 or the like.

The various embodiments may be combined as appropriate. For example, the spring portion SPa described in the second embodiment may be combined with either of the first and third embodiments (or modifications thereof). The structure of each of the insulating members 11a and 21b described in the modification of the third embodiment may be combined with either of the first and second embodiments. The semiconductor device 1 may include multiple terminals TMU and/or multiple terminals TML. The numbers of terminals TMU and TML may differ from one another. The number of signal terminals provided in the semiconductor device 1 may be changed as appropriate in accordance with the design of the semiconductor device 1 and/or intended final uses.

In the present specification, the term "connection" or "connected" may refer to being electrically connected, but such usage does not exclude another element being interposed between "connected" components or within the "connection" path. In a case of "electrically connected", even an insulating material may be interposed between components referred to being "electrically connected" provided that an operation can be carried out in substantially the same way as directly electrically connected components. A "claw form structure" and a "claw portion" may change elastically (deform) when the part 20 is attached or being attached to the case 10.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a semiconductor circuit having an electrode on a first surface;
    a case part surrounding the semiconductor circuit; and
    a matching part including an insulating material, a signal terminal on an outside of the insulating material, and a lead on the inside of a portion of the insulating material, the lead being that is electrically connected to the signal terminal, wherein
    the case part has a sidewall that extends in a first direction from the first surface,
    the sidewall includes a receiving portion that is recessed convexly in a second direction parallel to the first surface into the sidewall,
    the matching part includes a mating portion that is configured to fit into the receiving portion when the case part and matching part are engaged with one another and attached after being pressed together,
    the mating portion consists of the insulating material,
    a portion of the receiving portion is above the mating portion in the first direction after the case part and matching part are attached, and
    the lead includes a contact portion that is in contact with the electrode when the matching part is attached to the case part, a first portion connecting between the signal terminal and the contact portion, and a spring portion between the first portion and the contact portion.

2. The semiconductor device according to claim 1, wherein the contact portion is pressed against the electrode by a pressure contact force generated by compression of the spring portion when the matching part is attached to the case part.

3. The semiconductor device according to claim 1, wherein case part is an open-ended rectangular box shape.

4. The semiconductor device according to claim 1, further comprising:
    a base substrate closing a lower open end of the case part, wherein
    the semiconductor circuit is on the base substrate.

5. The semiconductor device according to claim 1, wherein the matching part includes a cover portion that covers an upper open end of the case part when the matching part is attached to the case part.

6. The semiconductor device according to claim 1, wherein the spring portion comprises a bent portion that extends in a direction parallel to the first portion.

7. The semiconductor device according to claim 1, wherein the spring portion comprises a loop portion.

8. The semiconductor device according to claim 1, wherein a portion of the lead other than the spring portion is thicker than spring portion.

9. The semiconductor device according to claim 1, wherein
    the semiconductor circuit includes a transistor, and
    the lead is electrically connected to a gate electrode of the transistor via the contact portion.

10. The semiconductor device according to claim 1, wherein the semiconductor circuit includes a power semiconductor element.

11. A power module, comprising:
a base substrate;
a semiconductor circuit on the base substrate;
an electrode for the semiconductor circuit on the base substrate;
an insulating case part on the base substrate surrounding the semiconductor circuit and the electrode in a plane parallel to a surface of the base substrate; and
a matching part including an insulating material, a signal terminal on an outside of the insulating material, and a lead on the inside of the insulating material, the lead being that is electrically connected to the signal terminal, wherein
the insulating case part has a sidewall that extends in a first direction from the base substrate,
the sidewall includes a receiving portion that is recessed convexly in a second direction parallel to the base substrate into the sidewall,
the matching part includes a mating portion that is configured to fit into the receiving portion when the insulating case part and matching part are engaged with one another and attached after being pressed together,
the mating portion consists of the insulating material,
a portion of the receiving portion is above the mating portion in the first direction after the insulating case part and matching part are attached,
the lead includes a contact portion that is in contact with the electrode when the matching part is attached to the insulating case part, a first portion connecting between the signal terminal and the contact portion, and a spring portion between the first portion and the contact portion.

12. The power module according to claim 11, wherein the first portion includes a branching portion, and the lead further includes a second contact portion and a second spring portion on a separate branch of the branching portion from the contact portion and the spring portion.

13. The power module according to claim 11, wherein the first portion of the lead includes an insert molded portion within the matching part.

14. A power module, comprising:
a base substrate;
a semiconductor circuit on the base substrate;
an electrode for the semiconductor circuit on the base substrate;
an insulating case part on the base substrate surrounding the semiconductor circuit and the electrode in a plane parallel to a surface of the base substrate; and
a cover part including a signal terminal on an outside of the cover part and a lead on the inside of the cover part that is electrically connected to the signal terminal, wherein
the insulating case part has a sidewall that extends in a first direction orthogonal to the surface of the base substrate,
the sidewall includes a receiving portion that is recessed convexly in a second direction parallel to the surface of the base substrate into the sidewall,
the cover part includes a mating portion that is configured to fit into the receiving portion when the insulating case part and cover part are directly engaged with one another and attached after being pressed together,
the mating portion consisting of an insulating material,
a portion of the receiving portion is above the mating portion in the first direction after the insulating case part and cover part are attached,
the lead includes a contact portion that is in contact with the electrode when the cover part is attached to the insulating case part, a first portion connecting between the signal terminal and the contact portion, and a spring portion between the first portion and the contact portion.

15. The power module according to claim 14, wherein the cover part covers an upper open end of the insulating case part when the cover part is attached to the insulating case part.

16. The semiconductor device according to claim 1, wherein the mating portion comprises a first portion and a second portion that extends from the first portion in the second direction such that the second portion is within the receiving portion after the case part and the matching part are attached.

17. The semiconductor device according to claim 1, wherein
the mating portion is an outer end of the matching part in the second direction, and
the receiving portion includes a protruding portion that extends upward from the sidewall in the first direction and includes a press fit portion that engages the mating portion.

18. The power module according to claim 11, wherein the mating portion comprises a first portion and a second portion that extends from the first portion in the second direction such that the second portion is within the receiving portion after the insulating case part and the matching part are attached.

19. The power module according to claim 11, wherein
the mating portion is an outer end of the matching part in the second direction, and
the receiving portion includes a protruding portion that extends upward from the sidewall in the first direction and includes a press fit portion that engages the mating portion.

20. The power module according to claim 14, wherein the mating portion comprises a first portion and a second portion that extends from the first portion in the second direction such that the second portion is within the receiving portion after the insulating case part and the matching part are attached.

21. The semiconductor device according to claim 1, wherein
the matching part further includes a plurality of mating parts spaced along a third direction crossing the first and second directions, and
the lead is between a pair of mating parts in the plurality of mating parts in the third direction.

* * * * *